United States Patent
Sangawa et al.

(10) Patent No.: US 6,335,664 B1
(45) Date of Patent: Jan. 1, 2002

(54) BRANCH CIRCUIT AND ITS DESIGNING METHOD, WAVEGUIDE-MICROSTRIP TRANSITION, AND APPLICATION TO HF CIRCUIT, ANTENNA AND COMMUNICATION SYSTEM

(75) Inventors: Ushio Sangawa, Sagamihara; Suguru Fujita, Tokyo, both of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/290,395

(22) Filed: Apr. 13, 1999

(30) Foreign Application Priority Data

Apr. 28, 1998 (JP) .......................................... 10-118318

(51) Int. Cl.⁷ .......................... H01P 5/107; H01P 5/109
(52) U.S. Cl. .......................... 333/128; 333/26; 333/24; 333/136; 333/134; 343/859; 343/862
(58) Field of Search .......................... 333/26, 34, 134, 333/136, 126, 128; 343/859, 862

(56) References Cited

U.S. PATENT DOCUMENTS

| | | | | |
|---|---|---|---|---|
| 2,825,876 A | * | 3/1958 | Le Vine et al. | 333/34 |
| 3,815,055 A | * | 6/1974 | Plunk et al. | 333/128 |
| 3,969,691 A | * | 7/1976 | Saul | 333/34 X |
| 4,168,479 A | * | 9/1979 | Rubin | 333/126 |
| 6,111,474 A | * | 8/2000 | Nibe | 333/26 |

FOREIGN PATENT DOCUMENTS

| | | |
|---|---|---|
| JP | 5-283915 | 10/1993 |
| JP | 5-335816 | 12/1993 |

* cited by examiner

Primary Examiner—Justin P. Bettendorf
(74) Attorney, Agent, or Firm—Connolly Bove Lodge & Hutz (57) ABSTRACT

A circuit assembly having a thin and large-area dielectric substrate and improved grounding. To make the assembly, a circuit board comprising the substrate, and a circuit pattern and a metal layer that are formed on respective sides of the substrate. A bath of conductive bonding material (e.g., a low melting point solder) is made inside a tray-like metal chassis of the assembly. The circuit board is floated on the bath and excessive portion of the conductive material is absorbed. A branch circuit for branching a first path into at least two second paths is provided by mainly using impedance transformers but by using fewest possible stub(s). Also, the elements are arranged in symmetry around the axis through the first path. This yields a wide operating frequency band. A waveguide-microstrip line transition that is easy to work and low in transition loss is provided by shaping the wider walls of the ridge waveguide so as to spread out toward the end. Since doing this increases the degree of freedom in design parameters, the width and the height of the ridge can be fitted to that of the microstrip line and that of the waveguide. The above elements is applicable to HF circuits, antennas and communication systems.

19 Claims, 10 Drawing Sheets

BRANCH CIRCUIT AND ITS DESIGNING METHOD, WAVEGUIDE-MICROSTRIP TRANSITION, AND APPLICATION TO HF CIRCUIT, ANTENNA AND COMMUNICATION SYSTEM

BACKGROUND OF THE INVENTION

1. Field of the Invention

The present invention relates to a high frequency (HF) circuit in a communication device and more specifically to a technique for bonding a circuit board to a metal chassis or case, a waveguide-microstrip line transition, a branch circuit, and a high frequency circuit incorporating these elements.

2. Description of the Prior Art

Recently, as frequency resources in communications technology are running dry, frequency bands available for building a new communications system have been and are shifting to higher bands. In this situation, the government and the people are jointly promoting a development to milliwave and microwave communication systems domestically and internationally. For example, it has been decided that extremely high frequency bands ranging from some GHz to hundreds GHz are assigned as available frequency bands to various communication systems under development for wireless LAN (local area network) and ITS (Intelligent Transport System).

Since available frequencies are rising as described above, antennas and HF (high frequency) circuits are desired which satisfactorily work in milliwave and microwave bands. However, design and manufacturing techniques that have been believed to be available may not work satisfactorily with an increase in frequency. For this reason, there is a need for novel design and manufacturing techniques.

Figure 1:
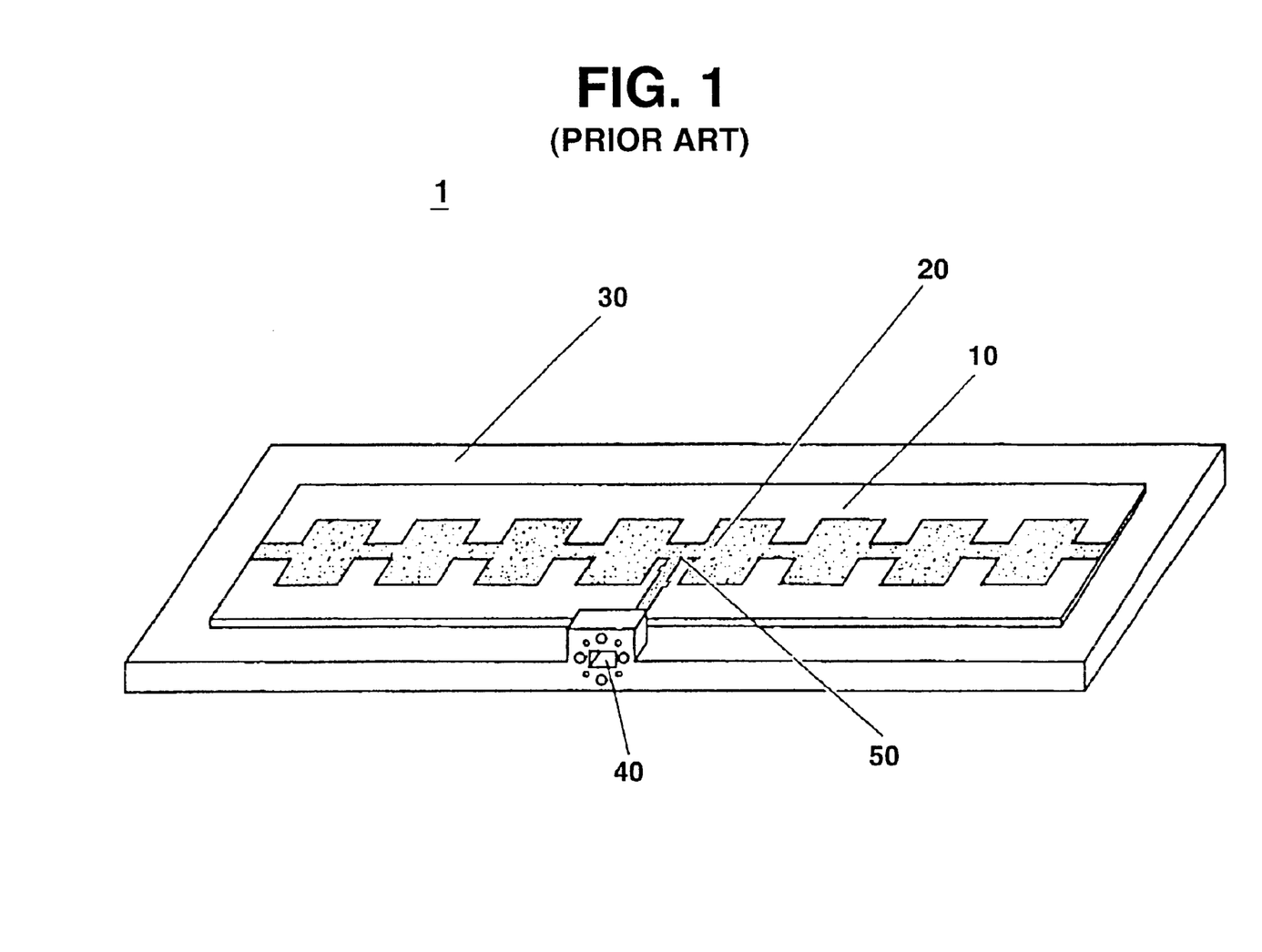
FIG. 1 is a diagram showing an arrangement of a prior art array antenna assembly 1.

FIG. 1 is a diagram showing an arrangement of a prior art array antenna assembly 1. In FIG. 1, the antenna assembly 1 comprises an dielectric substrate 10, a circuit pattern 20, a chassis 30 that holds the dielectric substrate 10 and serves as the ground, and a waveguide-microstrip line transition 40. The circuit pattern 20, which constitutes an array antenna, includes a T branch circuit 50. A signal transmitted through a waveguide (not shown) is passed by the transition 40 to a microstrip line of the circuit pattern 20, and further passed by the T branch circuit 50 to the right and the left portions of the array antenna.

Figure 2:
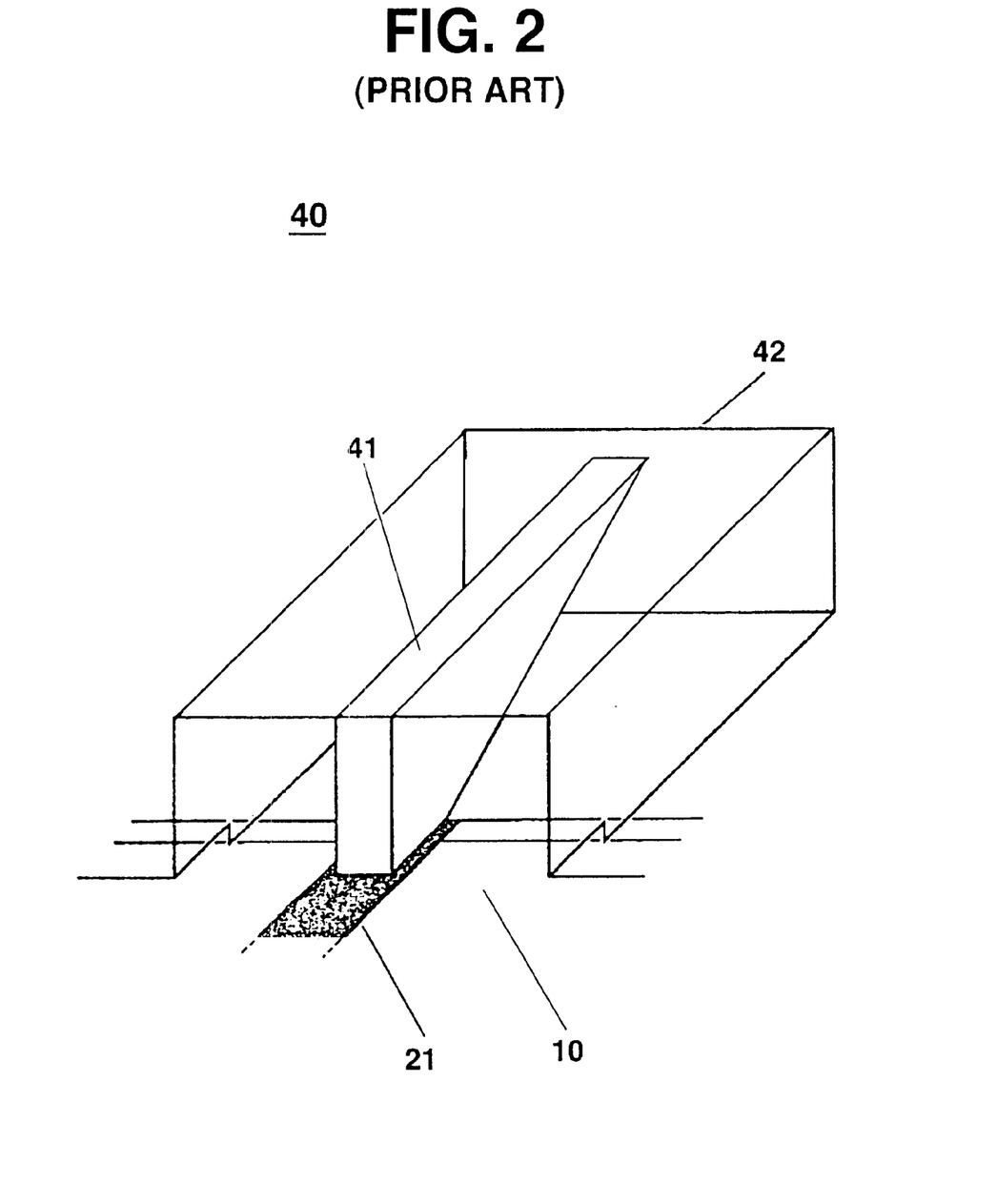
FIG. 2 is a diagram showing an arrangement of the waveguide-microstrip line transition 40 of FIG. 1.

FIG. 2 is a schematic diagram showing an arrangement of the transition 40 of FIG. 1. In FIG. 2, the transition 40 comprises a ridge waveguide 42, a ridge 41 formed inside the ridge waveguide 42, and a microstrip line 21 which is formed on the dielectric substrate 10 and which is extending to (or a part of) the circuit pattern 20. As described above, the signal transmitted through the not-shown waveguide is converted into a transmission mode of the microstrip line 21 by the ridge 41 provided inside the waveguide 42 and transmitted to the array antenna 20.

Problems exist in conjunction with working if an antenna with the just-described arrangements are to be implemented for milliwave or microwave. With an increase in frequency, dielectric materials available for the dielectric layer 10 is limited to substances lack of a mechanical strength, e.g., ceramics, quartz, silicon, etc. Further, if an antenna that radiates a beam of two degrees in mesial width in a 76 GHz band is to be fabricated, the dielectric substrate 10 for the antenna will be approximately 100 to 300 μm thick and 15 cm long in one side. Bonding such a thin and wide substrate 10 to the chassis 30 often results in a breakage of the dielectric substrate 10. Also, as the frequency increases, the characteristics of the antenna 20 depends strongly on the earthing state of the dielectric substrate 10. For this reason, a sufficient electrical contact is indispensable for the junction of the dielectric substrate 10 and the circuit pattern 20. However, this is hard to be achieved by conventional techniques.

Since the degree of freedom is very low in designing a waveguide-microstrip line transition, i.e., the design parameters are limited only to the width, the length and the height of the ridge 41, this sometimes causes the width of ridge for a milliwave band to be extremely narrow. Accordingly, the height of the ridge 41 of the transition 40, which is manufactured through machining of a brass material, becomes higher as compared with the ridge 41 width, making the work difficult. The lack of freedom in the design makes transition with a microstrip line having a lower characteristic impedance difficult and difference between the widths of the designed ridge 41 and the microstrip line 21 leads to an unexpected deterioration in the impedance matching characteristics.

Figure 3:
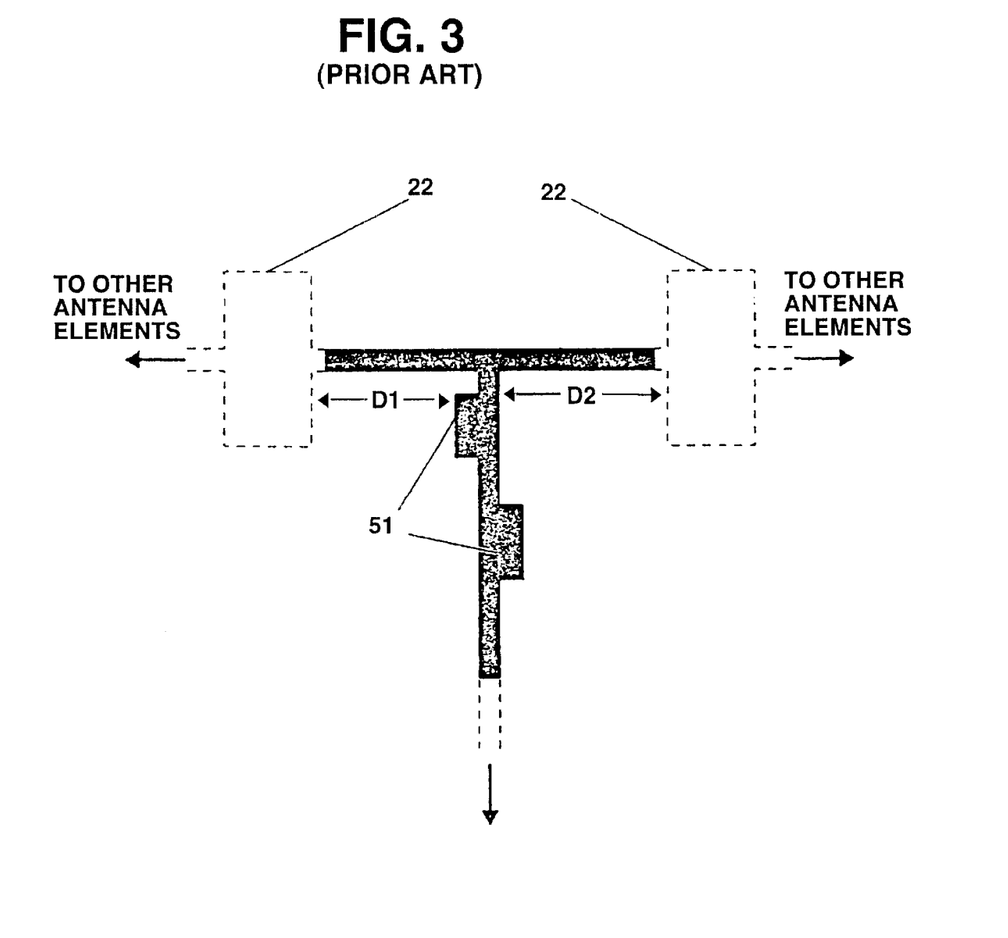
FIG. 3 is a diagram showing an exemplary pattern of a conventional T branch circuit comprising a matching circuit that uses stubs.

As is not limited to a high frequency (HF) antenna, an array antenna 20 as a whole generally exhibits a narrower frequency band characteristic with an increase in the number of array elements. Taking for example an antenna used in a front monitoring radar being put to practical use in 60 GHz, the antenna needs a beam width of about 2 degrees and accordingly a very large size. If a structure incorporating a conventional branch circuit were used as it is for such antenna, the resultant antenna would exhibit a very narrow frequency band characteristic, causing the band width of the antenna to be narrower than that of the radar. This is because conventional branch circuits mainly use stubs for impedance matching. FIG. 3 is a diagram showing an exemplary pattern of a conventional T branch circuit comprising a matching circuit that uses stubs 51 (the T branch circuit is shown as a dark area). Using stubs for impedance matching generally tends to narrow the frequency characteristics of the circuit. Specifically, the larger the distances (D1 and D2) between the matching circuit and circuits (22) that need matching, the narrower the frequency band of the whole circuit. However, if stubs are to close to the antenna (or the circuits that need matching) so as to broaden the frequency band of the antenna, the antenna will fail to provide the desired characteristics. Thus, matching by stubs while providing a desired characteristic to the antenna or the circuits having their impedance matched inevitably narrows the frequency band of the resultant circuit such as an antenna.

SUMMARY OF THE INVENTION

The invention is directed to solving these and other problems and disadvantages of the prior art.

It is an object of the invention to provide a technique of bonding a thin and large-area circuit substrate to a metal layer with a sure and uniform contact but no fear of substrate breakage; a waveguide-microstrip transition that has a high degree of freedom in design and easy to work; and a branch circuit that permits the frequency band of circuit to be wide.

It is another object of the invention to provide a high frequency circuit and an antenna that incorporate an circuit substrate implemented by such a bonding technique, such a waveguide-microstrip transition and such a branch circuit, and to provide a communication system using such a high frequency circuit and such an antenna.

According to an aspect of the invention, a method of bonding a circuit board with a metal plate is provided. The method includes the steps of working the metal plate so as to have a shape that permits a fluid to form a bath in an area including a part where the circuit board is to be bonded; heating the worked metal plate to such a temperature as melt a conductive bonding material; forming a bath of the conductive bonding material in the area of the metal plate; floating the circuit board on the bath; and absorbing excessive portion of the conductive material without applying a force to the dielectric substrate.

A circuit assembly according to just-described aspect of the invention is provided with a thin and large-area dielectric substrate with an improved earthing condition. A bonding agent with a low melting point, a low melting point solder, etc. may be used as conductive material.

According to another aspect of the invention, a branch circuit for branching a first path into at least two second paths in a high frequency circuit is provided. The impedance matching between the first path and each of the branch paths is achieved by mainly using impedance transformers but by using fewest possible stub(s) in the branch circuit. The first path, the second paths, the impedance transformers, and the fewest possible stub(s) are arranged in symmetry with respect to a plane of symmetry that runs through the first path.

In one embodiment, the impedance transformers are step impedance transformers.

According to another aspect of the invention, a waveguide-microstrip line transition that is easy to work and low in transition loss is provided. The transition comprises a fanwise tube having a first opening coupled with a waveguide and a second opening larger in size then the first opening, a first and a second wider wall of the tube spreading from the first opening toward the second opening; an end portion of a microstrip line formed on a dielectric substrate arranged near the first wider wall, the end portion being situated a little inside the second opening and on a plane of symmetry for the first and the second wider walls; and a ridge formed on the second wider wall, the ridge protruding gradually from a first opening side toward a second opening side to become short-circuited, at the end thereof, with the end portion of the microstrip line, wherein dimensions of the fanwise tube and a shape of the first and the second wider walls are determined so as to fit the width of the microstrip line to the end portion of the microstrip line.

In one embodiment, at least a part of each longitudinal side of a fanning-out portion of the wider walls is linear. However, at least a part of each longitudinal side may accords substantially with an exponential function or a trigonometric function.

BRIEF DESCRIPTION OF THE DRAWING

The features and advantages of the present invention will be apparent from the following description of an exemplary embodiment of the invention and the accompanying drawing, in which.

Throughout the drawing, the same elements when shown in more than one figure are designated by the same reference numerals.

DETAILED DESCRIPTION OF THE PREFERRED EMBODIMENTS

Figure 4:
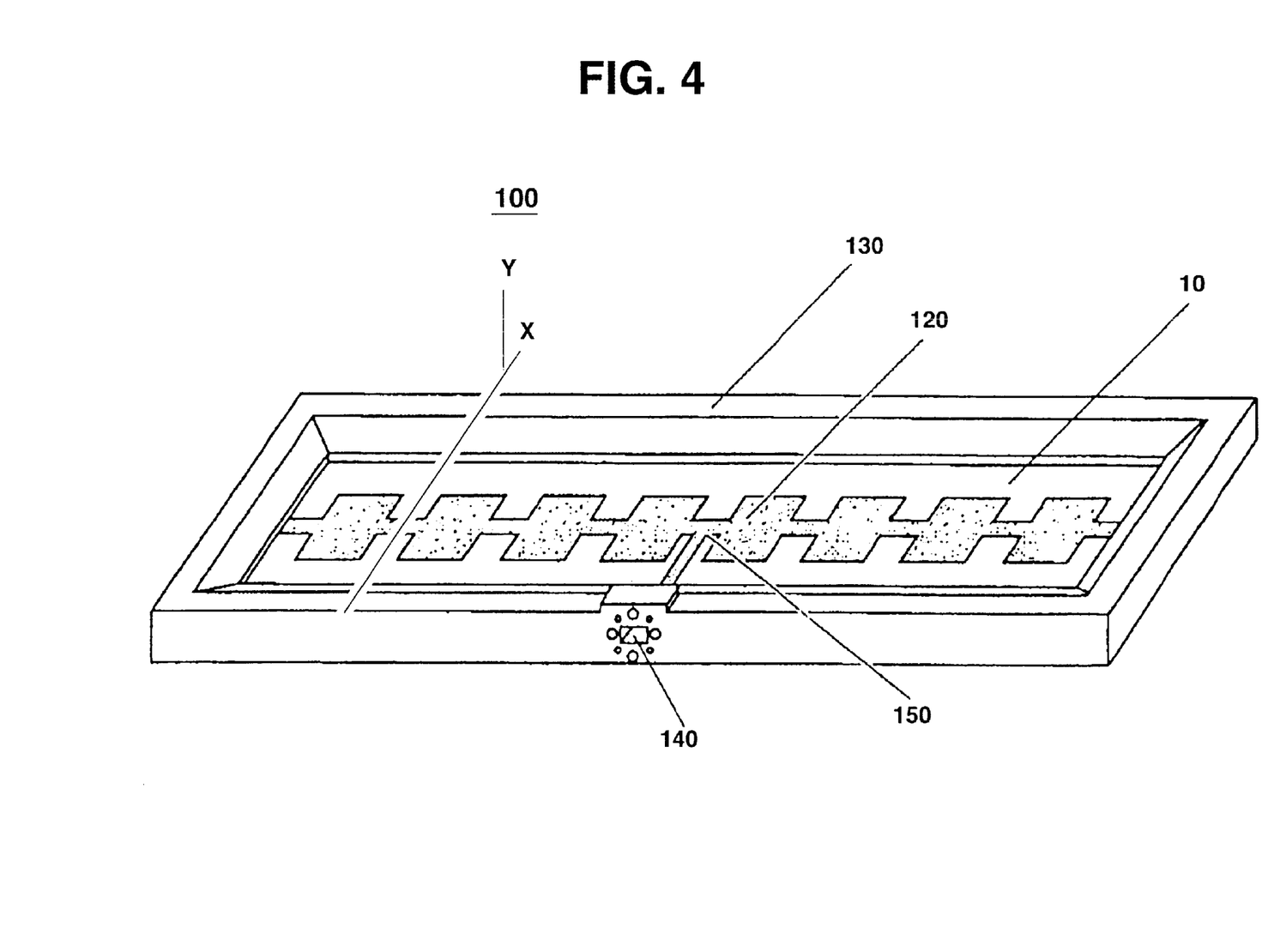
FIG. 4 is a schematic diagram showing an exemplary arrangement of an array antenna assembly according to an illustrative embodiment of the invention.

FIG. 4 is a schematic diagram showing an exemplary arrangement of an array antenna assembly 100 according to an illustrative embodiment of the invention. In FIG. 4, the antenna assembly 100 comprises a dielectric substrate 10, a circuit pattern or an array antenna 120 formed by patterning a metal film on the dielectric substrate 10 through photocopying, etching, etc., a chassis 130 that holds the dielectric substrate 10 and serves as the ground, and a waveguide-microstrip line transition 140 formed in the edge of the chassis 130. The circuit pattern 120 serves as a microstrip antenna array. A signal transmitted through a waveguide (not shown) is passed by the transition 140 to a microstrip line coupled to the circuit pattern 120, and further passed by the T branch circuit 50 to the right and the left portions of the array antenna 120.

Bonding the Dielectric Substrate

Figure 5:
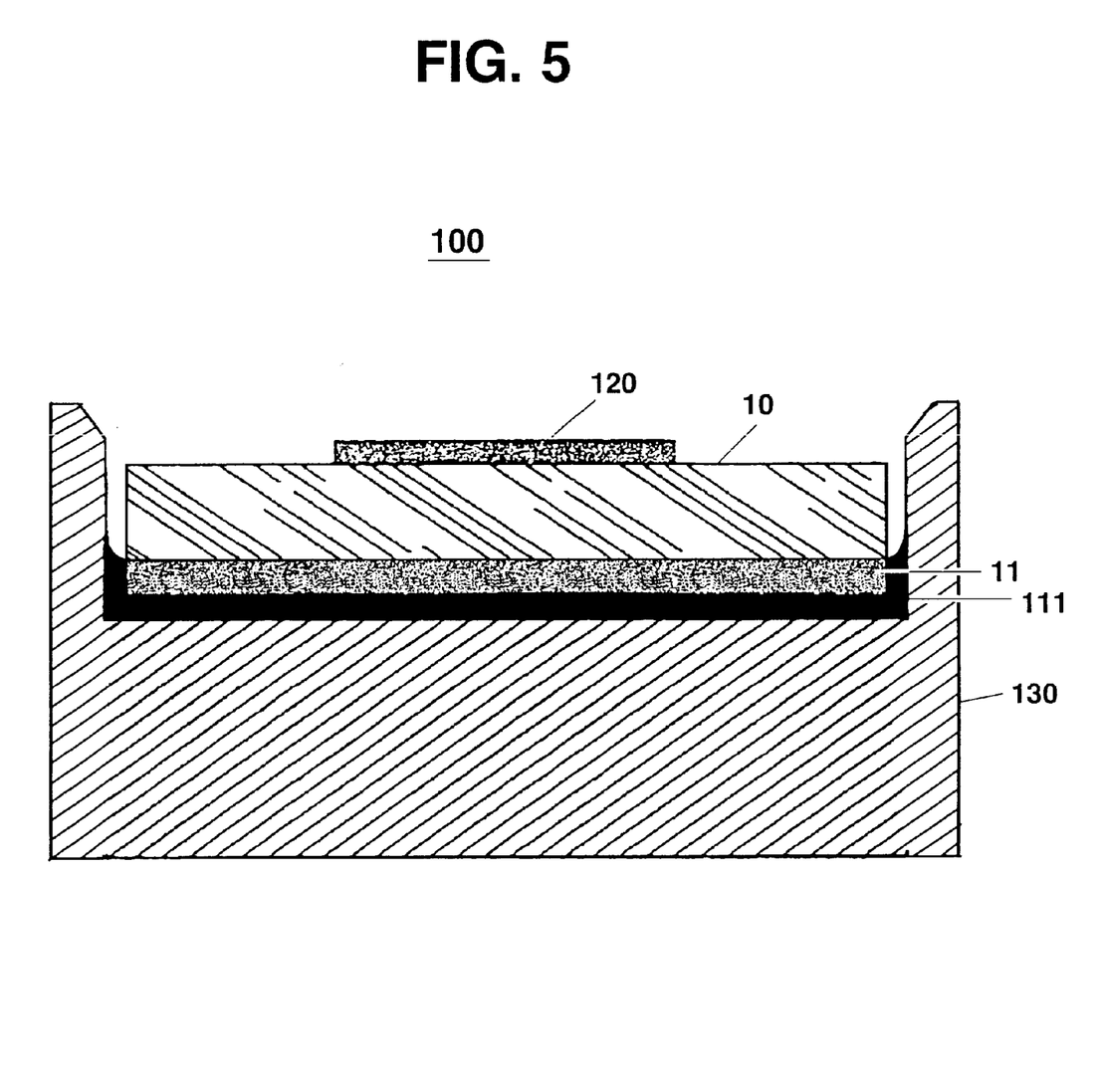
FIG. 5 is a schematic sectional view taken along the plane X-Y of FIG. 4.

FIG. 5 is a schematic sectional view taken along the plane X-Y of FIG. 4. In FIG. 5, the antenna assembly 100 comprises metal layers 120 and 11, the dielectric layer 10, a solder layer 111 and the chassis 130. The metal layer 120 on the dielectric layer 10 comprises a circuit pattern forming a microstrip structure in cooperation with the metal layer 11. The metal layer 120, the dielectric layer 10 and the metal layer 11 constitute a circuit board 120+10+11. According to the invention, the metal layer 11 of the circuit board 120+10+11 is bonded with the chassis 130 by means of a bonding material of a good conductivity, which realizes sufficient earthing and strong support of the circuit board. In this specific embodiment, a lower-melting-point solder is used as the bonding material. It should be noted that the chassis 130 is not a flat plate but has a concavity on one side thereof as shown in FIG. 5.

Figure 6:
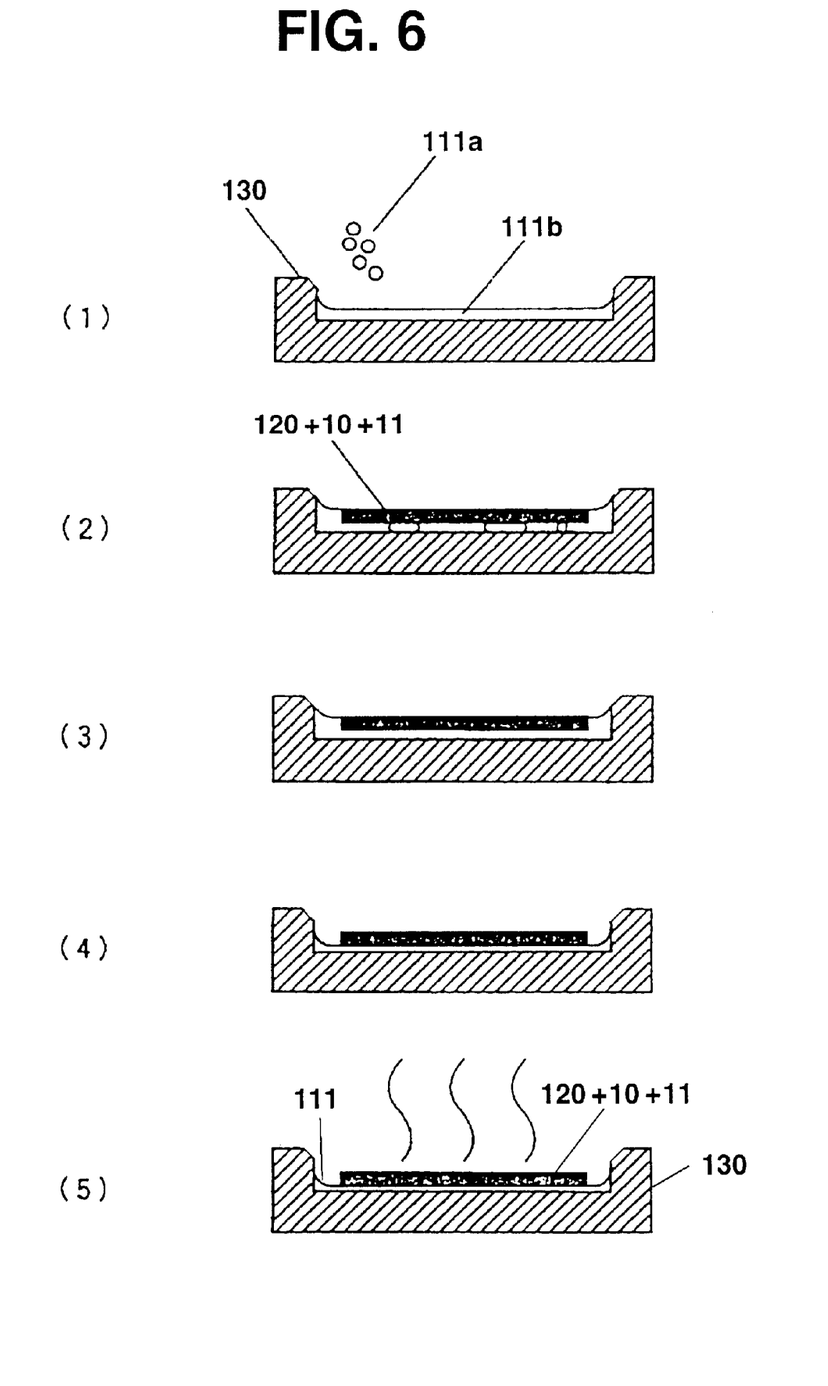
FIG. 6 is a diagram showing an exemplary process of bonding the metal layer 11 of a circuit board to the chassis 130 in accordance with the principles of the invention.

FIG. 6 shows how the metal layer His bonded with the chassis 130 in accordance with the principles of the invention. The processing steps are as follows:

(1) Put solder 111a in the concavity of the heated chassis 130 to make a solder bath 111b. The solder 111a is preferably a low melting point solder with a low melting point. Because if the difference between the rates of expansion for the substrate 10 and the chassis 130 is large, heating too much for a higher melting point solder may cause the substrate 10 to break during a cooling process.

(2) Float the circuit board 120+10+11 on the solder bath 111b. The circuit board floats of itself due to the surface tension of the solder 111b.

(3) Get the metal layer 11 of the circuit board attached to the solder 111b, getting bubbles out from between the metal layer 11 and the chassis 130.

(4) Remove excessive solder by absorbing solder 111b little by little without applying external force directly to the circuit board. The absorption of solder 111b is achieved by using a dedicated copper fiber.

(5) Cool taking a sufficient time such that any undesirable stress will not remain in the resultant assembly.

The just-described process enables even a thin and large-area dielectric substrate 10 (i.e., circuit board 120+10+11) from which alone a sufficient mechanical strength can not be expected to be bonded with the chassis 130 without a fear of breaking the substrate 10 (or the circuit board), realizing good earthing.

Though the inventive bonding technique has been described in conjunction with an antenna assembly 100 using an array antenna pattern 20, the inventive technique may be applied to any high frequency (HF) circuit assembly with any circuit pattern.

It is noted that any suitable conductive bonding agents may be used instead of the solder 111a. In this case, the bonding agents are preferably low in the temperature and small in the ratio of volume change at about the hardening temperature.

The inventive bonding technique has been described in conjunction with bonding a circuit board with a chassis. However, the inventive technique is applicable to bonding a thin and large-area circuit board with a metal surface in a concavity or a metal surface fringed with walls.

Waveguide-Microstrip Line Transition

Figure 7:
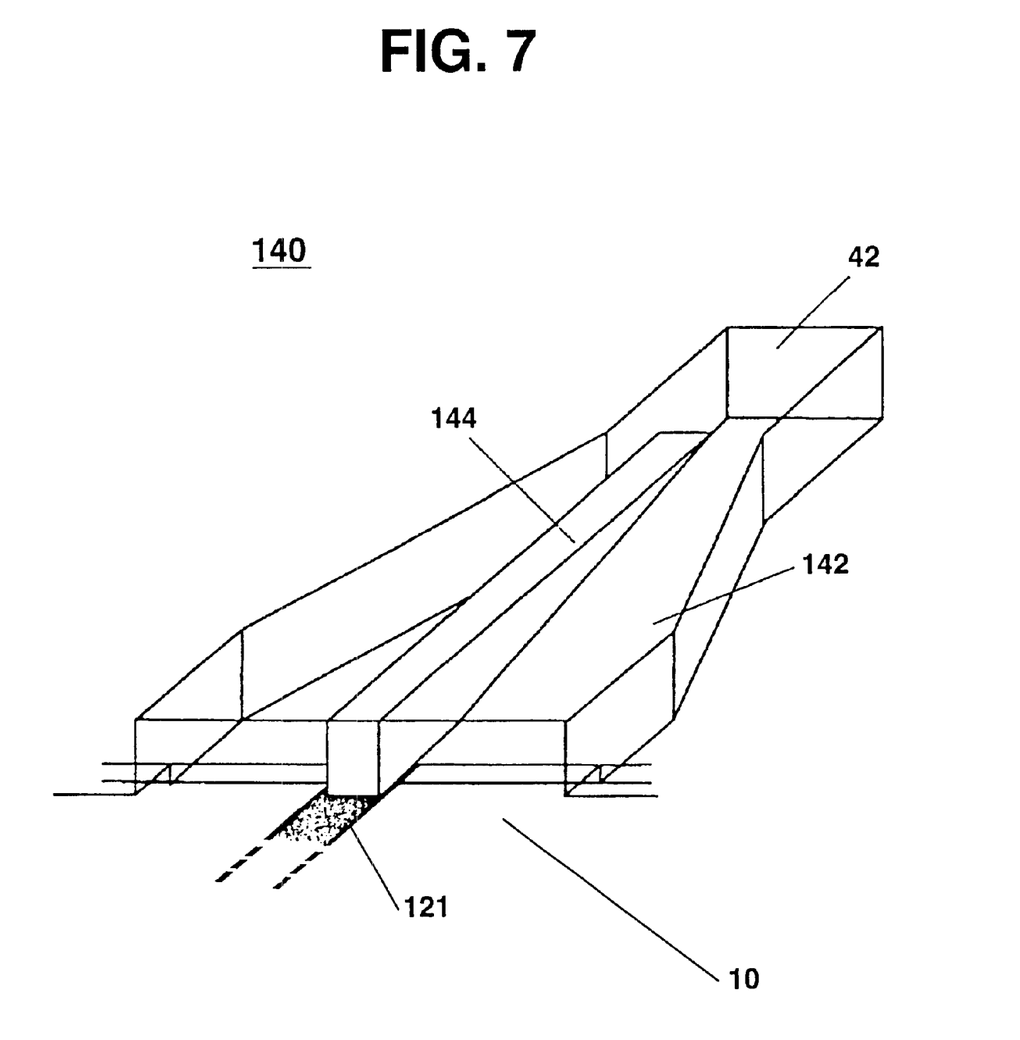
FIG. 7 is a schematic diagram showing an exemplary arrangement of the waveguide-microstrip line transition 140 of FIG. 4.

FIG. 7 shows an exemplary arrangement of the waveguide-microstrip line 20 transition 140 of FIG. 4. In FIG. 7, the transition 140 comprises an extension 42 of a waveguide (not shown), a fanwise tube (i.e., a tube spreading out toward the end) 142, a ridge 144 so formed as to protrude inside the fanwise tube 142, and a microstrip line 21 formed on the dielectric substrate 10 and extending to (or forming a part of) the circuit pattern 120. The fanwise tube 142 has a horn-like structure with a rectangular cross section perpendicular to the current direction. The two opening of the fanwise tube 142 differ in dimensions from each other. The transition 140 serves as a transition between the waveguide extension 42 and the microstrip line 121. The transition 140 is a so-called ridge waveguide converter provided, in the center of the fanwise tube 142, with a ridge 144 of a wedge shape. Specifically, the electromagnetic fields distributed all over the opening of the waveguide extension 42 is gradually converged on the head of the ridge 144 and finally made resemble the electromagnetic transmission mode of the microstrip line 121 thereby to be power-transmitted to the microstrip line 121.

According to the present invention, the line conversion characteristics of the transition 140 are a function of (i.e., can be controlled by) not only the dimensions of the ridge 144 but also the shape of fanning of the fanwise tube 142. That is, using a tube spreading out like an unfolded fan has increased the degree of freedom in designing the ridge 144. Since the designer can freely select the width and the height of the ridge 144, the transition 140 can be so designed as to have desired line conversion characteristics with a reduced parasitic impedance near the interface between the ridge 144 head and the microstrip line 121. In this way, the inventive transition 140 is easy to work, relatively lower in conversion loss and better in conversion characteristics.

Also, since the height of the ridge 144 can be set identical to that of the fanwise tube 142, the fanwise tube 142 with a high precision in the dimensions is provided, which contributes to better line conversion characteristics of the resultant transition 140.

The fanwise tube 142 has been shown as linearly shaped in FIG. 7. However, the tube 142 may have any nonlinear shape that spreads out toward the end. The side of the tube 142 may be curved according to, e.g., an exponential function, a trigonometric function, etc. The two opening of the tube 142 may have any suitable geometric shape different from each other to exhibit different characteristic impedance.

Though the transition 140 has been described as a waveguide-microstrip transition provided in a path to an antenna, the transition 140 according to the invention can be applied to an ordinary high frequency circuit.

Branch Circuit

Figure 8:
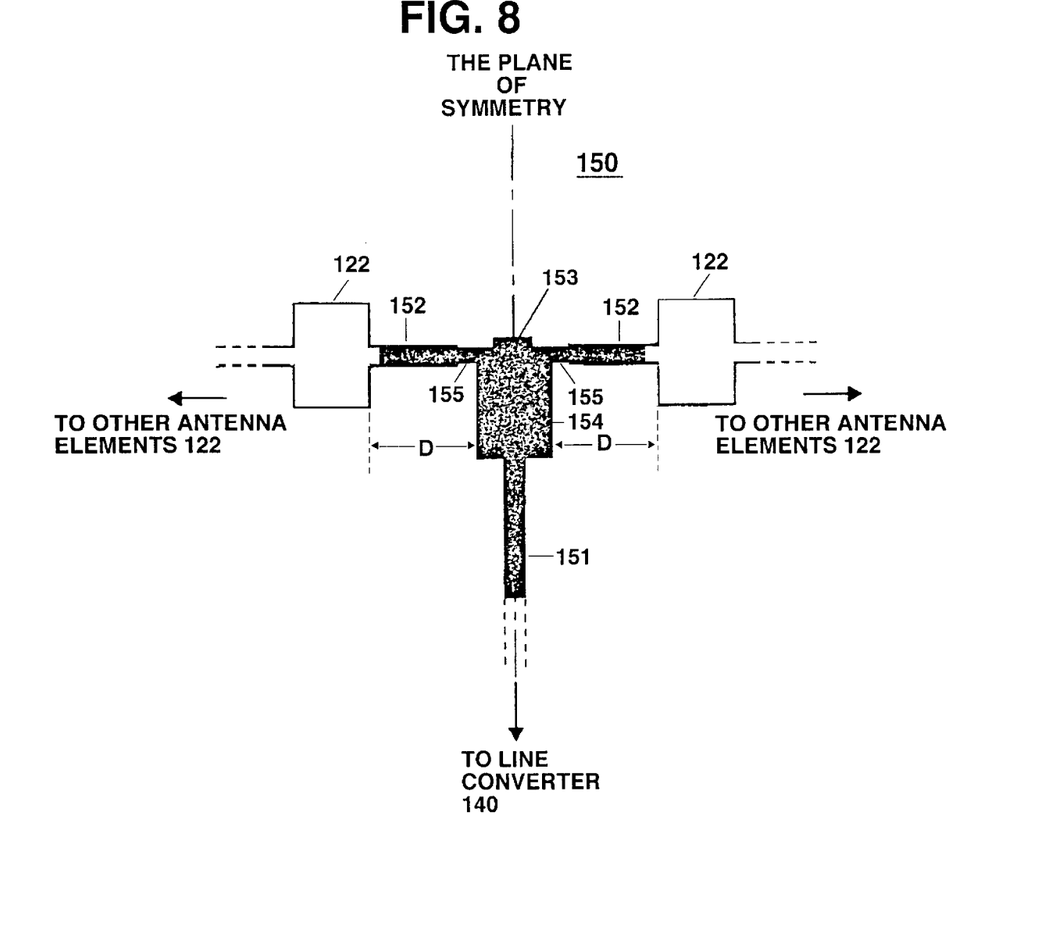
FIG. 8 is a schematic diagram showing an exemplary pattern of the T branch circuit 150 of FIG. 4.

FIG. 8 is a schematic diagram showing an exemplary pattern of the T branch circuit 150 of FIG. 4 as a dark area. In FIG. 8, the T branch circuit 150 comprises a root path 151, two branch paths 152, a stub 153 and step impedance transformers 154 and 155. The amplitude and the phase of the signals supplied to the antenna elements 122 are controlled by design parameters of the step impedance transformers 154 and 155. The T branch circuit 150 is configured symmetrical about the plane of symmetry that runs through the root path 151.

In this specific embodiment, the T branch circuit 150 is so configured that each of the root path 151 and the branch paths 152 has a characteristic impedance of 50 Ω. The signal on the root path 151 is distributed into the two paths 152 with an equal power and a same phase. The branch paths 152 are coupled in serial with the antenna elements 122. Arrangements are made such that the overall impedance of the branch circuit has an impedance smaller than 50 Ω.

It should be noted that the T branch circuit 150 achieves impedance matching by mainly using step impedance transformers (154 and 155×2) but using the fewest possible stubs (153). Doing this makes the band width of the whole circuit or array antenna 120 wider as compared with an ordinary circuit that uses stubs for impedance matching. Generally speaking, an antenna has to have a frequency band width wider than the sum of the band width occupied by the communication system where the antenna is incorporated and a frequency error involved in the manufacturing process of the antenna. The inventive T branch circuit 150 enables implementation of such a wide band circuit or antenna.

An illustrative embodiment has been described in conjunction with the T branch circuit 150 having two branch paths. However, the invention is applicable to any T branch circuits having more than two branch paths. A wider band HF circuit and a communication system can be implemented by using a T branch circuit according to the principles of the invention.

Figure 9:
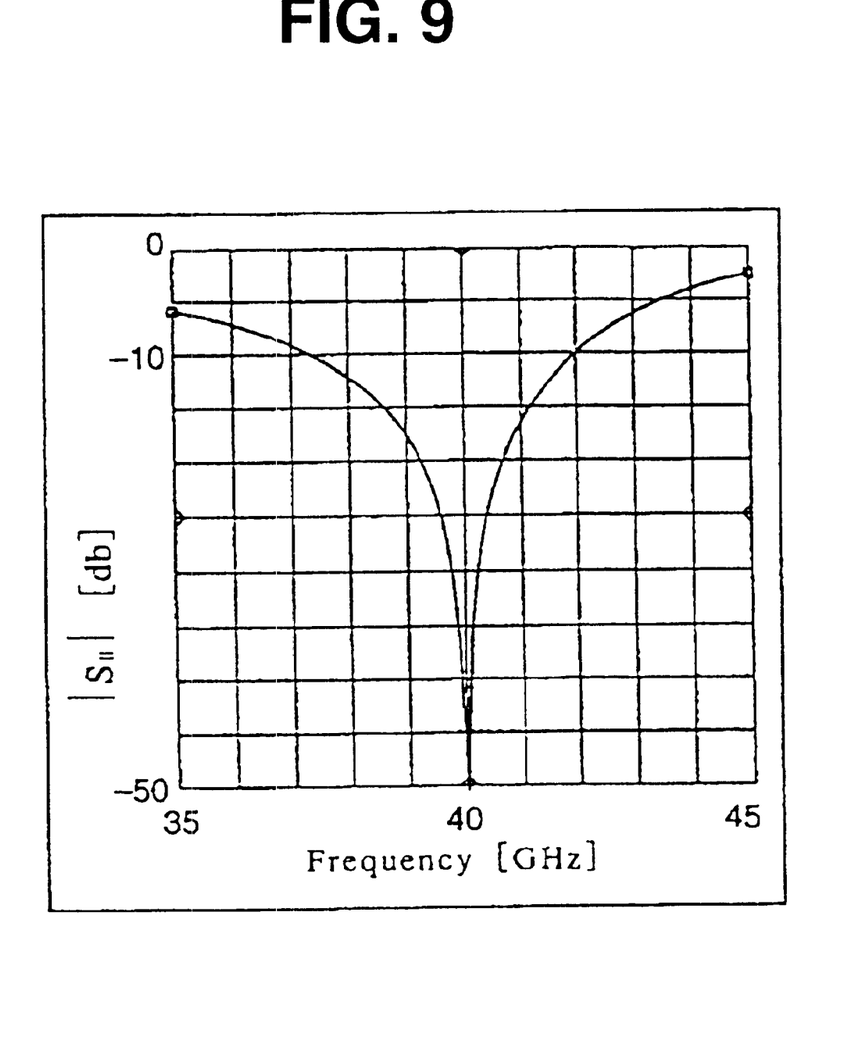
FIG. 9 is a diagram showing a reflection characteristic curve of the antenna 100 incorporating the inventive T branch circuit 140.
Figure 10:
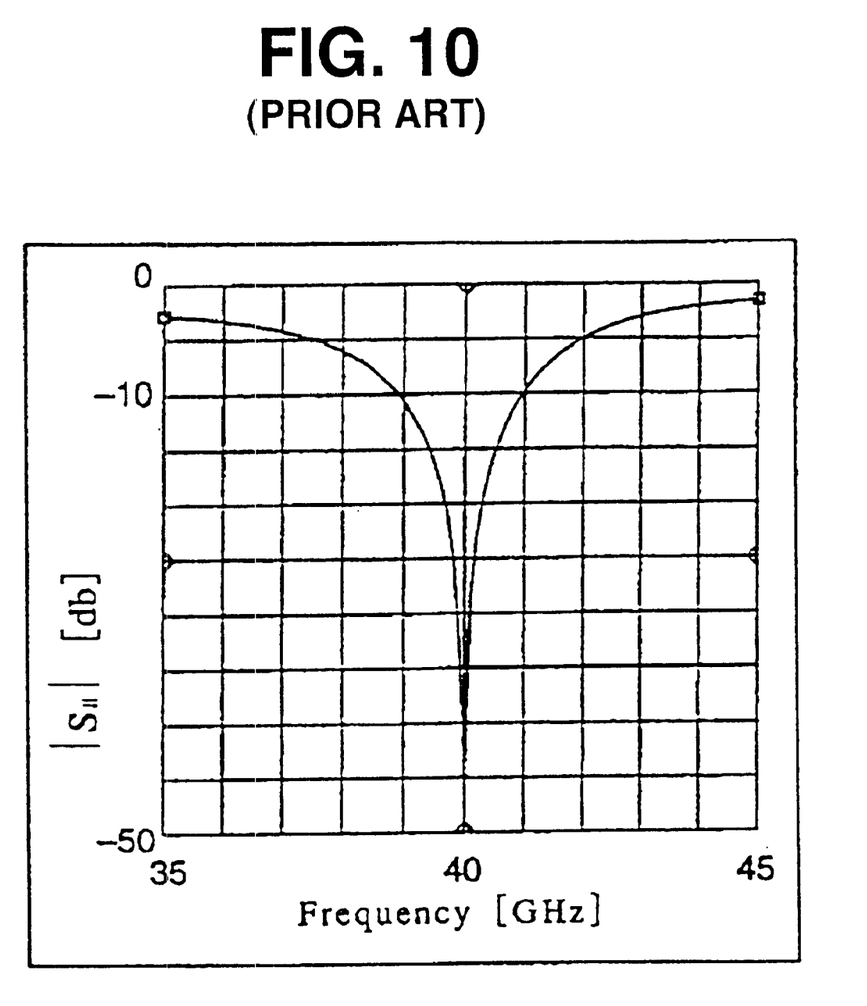
FIG. 10 is a diagram showing a reflection characteristic curve of the conventional antenna 1 of FIG. 1.

FIG. 9 is a diagram showing a reflection characteristic curve of the antenna 100 incorporating the inventive T branch circuit 140. FIG. 10 is a diagram showing a reflection characteristic curve of the conventional antenna 1 of FIG. 1. In FIGS. 9 and 10, the axis of abscissas indicates the frequency from 35 through 45 GHz, and the axis of ordinates indicates the return loss viewed from the entrance to the root path. The T branch circuit 150 according to the invention have achieved matching such that the return loss is less than −10 dB for 4 GHz from 37.3 through 42 GHz as shown in FIG. 9. On the other hand, the conventional T branch circuit 50 of FIG. 3 have achieved matching of less than −10 dB for 2 GHz from 39 through 41 GHz as shown in FIG. 10. Thus, a T branch circuit according to the present invention yields substantially twice of the band width of conventional one.

Many widely different embodiments of the present invention may be constructed without departing from the spirit and scope of the present invention. It should be understood that the present invention is not limited to the specific embodiments described in the specification, except as defined in the appended claims.

What is claimed is:

1. A branch circuit with a wide frequency band for use in a high frequency circuit, comprising:
    a first path which is an end portion of an input path;
    at least two second paths branching from said first path;
    means, disposed in said first path and/or said second paths and differing in width from adjacent paths, for transforming impendence; and
    a minimum number of one or more stub(s) provided in said first path and/or said second paths, wherein:
        impedance matching between said first path and said at least two branch paths is achieved by mainly using said impedance transforming means but by using said stub(s) are arranged in symmetry with respect to a plane of symmetry that runs through said first path.

2. A branch circuit as defined in claim 1, wherein said impedance transforming means are step impedance transformers.

3. A method of designing a branch circuit for branching a first path into at least two second paths in a high frequency circuit, the method including the steps of:
    providing a matching impedance between said first path and said at least two branch paths by using impedance transformers and a minimum number of one or more stub(s) in said branch circuit to maintain a maximum frequency of bandwidth; and
    arranging said first path, said at least two second paths, said impedance transformers, and said fewest possible stub(s) in symmetry with respect to a plane of symmetry that runs through said first path.

4. A method as defined in claim 3, further including the step of selecting step impedance transformers as said impedance transformers.

5. A waveguide-microstrip line transition that is easy to work and low in transition loss, comprising:
    a fanwise tube having a first opening coupled with a waveguide and a second opening larger in size then said first opening, a first and a second wider wall of said tube spreading from said first opening toward said second opening;
    an end portion of a microstrip line formed on a dielectric substrate arranged near said first wider wall, said end portion being situated a little inside said second opening and on a plane of symmetry for said first and said second wider walls; and
    a ridge formed on said second wider wall, said ridge protruding gradually from the first opening toward the second opening to become short-circuited, at the end thereof, with said end portion of said microstrip line, wherein dimensions of said fanwise tube and a shape of said first and said second wider walls are determined so as to fit the width of said microstrip line to said end portion of said microstrip line.

6. A waveguide-microstrip line transition as defined in claim 5, wherein at least a part of each longitudinal side of a fanning-out portion of said wider walls is substantially linear.

7. A waveguide-microstrip line transition as defined in claim 5, wherein at least a part of each longitudinal side of a fanning-out portion of said wider walls accords substantially with an exponential function.

8. A waveguide-microstrip line transition as defined in claim 5, wherein at least a part of each longitudinal side of a fanning-out portion of said wider walls accords substantially with a trigonometric function.

9. A circuit assembly provided with a dielectric layer electrically coupled with a metal chassis with a raised conductivity, comprising:
    a metal chassis constituting at least one side of said circuit assembly;
    a first metal layer, one side of which is bonded with an inside bottom of said metal chassis by using a highly conductive bonding material with substantially no bubbles left between said inside bottom and said first metal layer; and
    a second metal layer formed on the other side of said dielectric layer and having a circuit pattern.

10. A circuit assembly as defined in claim 9, wherein a bonding agent with a low melting point is used for said conductive bonding material.

11. A circuit assembly as defined in claim 9, wherein a low melting point solder is used for said conductive bonding material.

12. A circuit assembly as defined in claim 11, wherein said circuit pattern is for a high frequency circuit.

13. A circuit assembly as defined in claim 11, wherein said circuit pattern is for a high frequency circuit including an array antenna elements.

14. A circuit assembly as defined in claim 11, wherein said circuit pattern includes a branch circuit with a wide frequency band in a high frequency area, said branch circuit comprising:
    a fist path;
    at least two second paths branching from said first path;
    at least one step impendence transformer disposed in said first path and/or said second paths; and
    a minimum number of one or more stub(s) provided in said first path and/or said second paths, wherein said first path, said at least two second paths, said step impedance transforming means and said stub(s) are arranged in symmetry with respect to a plane of symmetry that runs through said first path.

15. A system with a communication capability, including a circuit assembly as defined in claim 14.

16. A circuit assembly as defined in claim 11, wherein said circuit pattern includes at least one microstrip line and a waveguide-microstrip line transition, said waveguide-microstrip line transition comprising:
    a fanwise tube having a first opening coupled with a waveguide and a second opening larger in size then said first opening, a first and a second wider wall of said tube spreading from said first opening toward said second opening;
    an end portion of one of said at least one microstrip line formed on a dielectric substrate arranged near said first wider wall, said end portion being situated a little inside said second opening and on a plane of symmetry for said first and said second wider walls; and
    a ridge formed on said second wider wall, said ridge protruding gradually from the first opening toward the second opening to become short-circuited, at the end thereof, with said end portion of said one microstrip line, wherein dimensions of said fanwise tube and a shape of said first and said second wider walls are determined so as to fit the width of said one microstrip line to said end portion of said microstrip line.

17. A system with a communication capability, including a circuit assembly as defined in claim 16.

18. A circuit assembly as defined in claim 16, wherein said circuit pattern includes a branch circuit with a wide frequency band in a high frequency area, said branch circuit comprising:

a first path;

at least two second paths branching from said first path;

at least one step impedance transformer disposed in said first path and/or said second paths; and minimum number of one or more stub(s) provided in said first path and/or said second paths, wherein said first path, said at least two second paths, said step impedance transforming means and said fewest possible stub(s) are arranged in symmetry with respect to a plane of symmetry that runs through said first path.

19. A system with a communication capability, including a circuit assembly as defined in claim 18.

* * * * *